(12) United States Patent
Mann

(10) Patent No.: US 10,007,187 B2
(45) Date of Patent: Jun. 26, 2018

(54) IMAGING OPTICAL SYSTEM

(71) Applicant: Carl Zeiss SMT GmbH, Oberkochen (DE)

(72) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/426,408

(22) Filed: Feb. 7, 2017

(65) Prior Publication Data

US 2017/0146912 A1    May 25, 2017

Related U.S. Application Data

(63) Continuation of application No. 15/155,356, filed on May 16, 2016, now Pat. No. 9,568,832, which is a (Continued)

(30) Foreign Application Priority Data

Sep. 15, 2010   (DE) ........................ 10 2010 040 811

(51) Int. Cl.
*G03F 7/20* (2006.01)
*G02B 17/06* (2006.01)
*G02B 13/08* (2006.01)
*G02B 5/09* (2006.01)
*G02B 26/08* (2006.01)

(52) U.S. Cl.
CPC ........... *G03F 7/70233* (2013.01); *G02B 5/09* (2013.01); *G02B 13/08* (2013.01); *G02B 17/0663* (2013.01); *G02B 26/0833* (2013.01); *G03F 7/701* (2013.01); *G03F 7/702* (2013.01)

(58) Field of Classification Search
CPC .................... G03F 7/70225; G03F 7/70216
See application file for complete search history.

(56) References Cited

U.S. PATENT DOCUMENTS 3,871,748 A    3/1975  Day
5,120,971 A    6/1992  Matsumura et al.
(Continued)

FOREIGN PATENT DOCUMENTS

CN    1474253 A    2/2004
CN    101226272 A    7/2008
(Continued)

OTHER PUBLICATIONS

The International Search Report for the corresponding PCT Application No. PCT/EP2011/065823, dated Mar. 12, 2012.
(Continued)

*Primary Examiner* — Michelle M Iacoletti
(74) *Attorney, Agent, or Firm* — Fish & Richardson P.C.

(57) ABSTRACT

An imaging optical system for a projection exposure system has at least one anamorphically imaging optical element. This allows a complete illumination of an image field in a first direction with a large object-side numerical aperture in this direction, without the extent of the reticle to be imaged having to be enlarged and without a reduction in the throughput of the projection exposure system occurring.

20 Claims, 9 Drawing Sheets

Related U.S. Application Data continuation of application No. 13/744,782, filed on Jan. 18, 2013, now Pat. No. 9,366,968, which is a continuation of application No. PCT/EP2011/065823, filed on Sep. 13, 2011.

(60) Provisional application No. 61/383,079, filed on Sep. 15, 2010.

(56) References Cited

U.S. PATENT DOCUMENTS

| | | |
|---|---|---|
| 5,710,619 A | 1/1998 | Jain et al. |
| 5,891,806 A | 4/1999 | Shibuya et al. |
| 5,914,774 A | 6/1999 | Ota |
| 6,507,440 B1 | 1/2003 | Schultz |
| 6,611,574 B2 | 8/2003 | Singer et al. |
| 6,658,084 B2 | 12/2003 | Singer |
| 6,771,352 B2 | 8/2004 | Dierichs |
| 6,859,515 B2 | 2/2005 | Schultz |
| 7,414,781 B2 | 8/2008 | Mann et al. |
| 7,682,031 B2 | 3/2010 | Mann et al. |
| 9,366,968 B2 | 6/2016 | Mann |
| 9,557,548 B2 | 1/2017 | Komatsuda |
| 9,568,832 B2 | 2/2017 | Mann |
| 2001/0019401 A1 | 9/2001 | Irie et al. |
| 2003/0227603 A1 | 12/2003 | Dierichs et al. |
| 2004/0051852 A1 | 3/2004 | Komatsuda |
| 2004/0264006 A1* | 12/2004 | Hatakeyama ...... G02B 17/0663 359/726 |
| 2005/0008870 A1 | 1/2005 | McGuire et al. |
| 2005/0030638 A1 | 2/2005 | Yoshihara |
| 2007/0058269 A1 | 3/2007 | Mann et al. |
| 2008/0036986 A1 | 2/2008 | Yamaguchi |
| 2008/0165415 A1 | 7/2008 | Chan et al. |
| 2008/0170216 A1* | 7/2008 | Mann ................ G02B 17/0848 355/66 |
| 2008/0170310 A1 | 7/2008 | Mann |
| 2008/0266686 A1 | 10/2008 | Dengel et al. |
| 2009/0122290 A1 | 5/2009 | Van Dam |
| 2009/0168034 A1 | 7/2009 | Staecker et al. |
| 2010/0195075 A1 | 8/2010 | Chan et al. |
| 2011/0116062 A1* | 5/2011 | Ono ................... G03F 7/70233 355/51 |
| 2012/0069312 A1 | 3/2012 | Mann et al. |
| 2012/0287413 A1 | 11/2012 | Komatsuda |
| 2013/0128251 A1 | 5/2013 | Mann |
| 2014/0320838 A1 | 10/2014 | Mann |
| 2016/0259248 A1 | 9/2016 | Mann |

FOREIGN PATENT DOCUMENTS

| | | |
|---|---|---|
| DE | 199 31 848 A1 | 1/2001 |
| DE | 10 2007 062 198 A1 | 6/2009 |
| DE | 10 2008 009 600 A1 | 8/2009 |
| JP | H07-183214 A | 7/1995 |
| JP | H10-10428 A | 1/1998 |
| JP | 2002-048977 | 2/2002 |
| JP | 2002-198309 A | 7/2002 |
| JP | 2002-203784 A | 7/2002 |
| JP | 2004-031808 A | 1/2004 |
| JP | 2004-128449 A | 4/2004 |
| JP | 2008-176326 A | 7/2008 |
| JP | 2009-508150 A | 2/2009 |
| WO | WO 2007/31271 A1 | 3/2007 |
| WO | WO 2010/091800 | 8/2010 |
| WO | WO 2011/065374 | 6/2011 |

OTHER PUBLICATIONS

Japanese office action with English translation with respect to parallel JP Appl No. 2013-528 634, dated Aug. 12, 2015.
Chinese office action, with English translation thereof, for CN Appl No. 2011 8004 4617.8, dated Sep. 2, 2014.
German Examination Report, with English translation, issued in DE App. No. 102010040811.5 dated Nov. 25, 2010.
Japanese office action with English translation with respect to Japanese patent application No. 2016-096 931, dated Feb. 16, 2017, 7 pages.

* cited by examiner

IMAGING OPTICAL SYSTEM

CROSS-REFERENCE TO RELATED APPLICATIONS

The present application is a continuation of, and claims priority under 35 USC § 120 to, U.S. application Ser. No. 15/155,356, filed May 16, 2016, now U.S. Pat. No. 9,568,832, which is a continuation of, and claims priority under 35 USC § 120 to, U.S. application Ser. No. 13/744,782, filed Jan. 18, 2013, now U.S. Pat. No. 9,366,968, which is a continuation of, and claims priority under 35 USC § 120 to, international application PCT/EP2011/065823, filed Sep. 13, 2011, which claims benefit under 35 USC § 119 of German Application No. DE 10 2010 040 811.5, filed Sep. 15, 2010 and also claims priority under 35 USC § 119(e) to U.S. Ser. No. 61/383,079, filed Sep. 15, 2010. The disclosure of each of these applications is incorporated herein by reference in its entirety.

FIELD

The disclosure relates to an imaging optical system for a projection exposure system, an illumination optical system for a projection exposure system and an optical system with an imaging optical system of this type. The disclosure also relates to a projection exposure system with an optical system of this type, a reticle for a projection exposure system, a method for producing a microstructured component with the aid of this projection exposure system and a component produced by the method.

BACKGROUND

Imaging optical systems are known from DE 10 2007 062 198 A1, U.S. Pat. No. 7,414,781 B2, U.S. Pat. No. 7,682,031 B2 and from WO 2010/091800 A1. Lithography systems are also known from US 2008/0036986 A1.

SUMMARY

The disclosure provides an imaging optical system for a projection exposure system with improved imaging quality.

According to the disclosure, it was recognised that with an increase in the object-side numerical aperture, the object-side main beam angle has to be enlarged, which can lead to shading effects owing to the absorber structure and to problems with the layer transmission, in particular to strong apodisation effects owing to the reticle coating.

According to the disclosure, it was further recognised that a reticle of a predetermined size can be imaged from an object field with a predetermined imaging scale on a predetermined illumination field via an anamorphic imaging optical system, in particular via an anamorphic imaging projection lens system, by which the illumination field is completely illuminated in the direction of the first imaging scale, while a reduced imaging scale in a second direction does not have a negative effect on the throughput of the projection exposure system, but can be compensated by suitable measures.

An anamorphic lens system therefore allows both complete illumination of an image face with a large object-side numerical aperture in the first direction (without the extent of the reticle to be imaged having to be enlarged in this first direction and without a reduction in the throughput of the projection exposure system occurring) and the minimisation of losses in imaging quality caused by inclined incidence of the illumination light.

An image flip is avoided by sign-identical imaging scales in the direction of the two principal planes. The optical system, in particular in the direction of the two principal planes, has positive imaging scales.

In one aspect, the disclosure provides an imaging optical system for a projection exposure system which includes at least one anamorphically imaging projection lens system having sign-identical imaging scales in the direction of the two principal planes.

In some embodiments, the at least one anamorphically imaging projection lens system has at least two part lens systems, of which at least one images anamorphically. Such an imaging optical system is particularly favourable to construct and allows particularly flexible adaptation of the imaging properties to the respective desired properties. In particular the first, i.e. object-side part lens system, images anamorphically. This can ensure that the radiations incident on the object field and reflected thereby do not overlap. The second part lens system is also anamorphic. It can also be non-anamorphic.

The projection lens system can have a circular exit pupil. The image-side numerical aperture is therefore direction-independent. This ensures an orientation-independent resolution. The anamorphic lens system according to the disclosure therefore has, in particular, an entry pupil with an elliptical shape. The semi-axes of the ellipse therefore have the same or rather the reverse relationship to one another as the different imaging scales or the different object-side numerical apertures.

The anamorphically imaging projection lens system can include at least one mirror. A smaller number of mirrors lead here to smaller transmission losses. A larger number of mirrors allows a more flexible and improved correction of imaging errors and allows a higher numerical aperture. According to the disclosure, the projection lens system includes at least one mirror, such as at least four mirrors, at least six mirrors, at least eight mirrors. The mirrors may, in particular, be configured as EUV radiation-reflecting mirrors.

An optical element with a freeform face allows a particularly flexible design of the imaging properties. This opens up, in particular with a given number of mirrors of the imaging optical system, further degrees of freedom for correcting imaging errors.

The imaging scale in a first direction can be at least one and a half times as large as in a second direction. It is, in particular, at least twice as large as in the second direction. Imaging scale is taken to mean here and below the absolute amount of the imaging scale given by the ratio of the imaging size to the article size, i.e. the size of the structure to be imaged in the image field of the projection lens system to the size of the structure to be imaged in the object field. It is ensured as a result that an illumination field with a predetermined width with a predetermined reticle, in particular with a reticle of a predetermined size can be exposed perpendicular to the scanning direction over the complete width. A smaller imaging scale, i.e. a stronger reduction, in the direction perpendicular to the width of the illumination field can be otherwise compensated, in particular by an increased scanning speed and therefore has no disadvantageous effects.

The reduced imaging scale in the direction perpendicular to the scanning direction, in particular, does not lead to throughput losses.

Direction-dependent different object-side numerical apertures can allow an advantageous design of the imaging optical system. In particular, problems with shading effects and layer transmission on the reticle can be avoided by this. The object-side numerical aperture (NAO) in a specific direction is, in particular, at least one and a half times as large, in particular at least twice as large, as in a direction perpendicular to this.

The illumination system preferably has an exit pupil, the shape of which is configured corresponding to the entry pupil of the projection lens system. According to the disclosure, an illumination system with an elliptical exit pupil is therefore provided.

This is, in particular, achieved by an elliptical pupil facet mirror or by an elliptical arrangement of the pupil facets on the pupil facet mirror, i.e. an arrangement, in which the envelope of all pupil facets forms an ellipse.

The semi-axes of the elliptically configured pupil facet mirror or the exit pupil of the illumination system have, in particular, the same relationship to one another as the two different imaging scales of the projection lens system or the semi-axes of the entry pupil thereof.

An imaging optical system with a large image-side numerical aperture, a small main beam angle and large image-side scanning slot width allows particularly good projection of the structures of a reticle in the image field.

In one aspect, the disclosure provides an illumination optical system for a projection exposure system. The illumination optical system includes at least one pupil facet mirror. The illumination system has an elliptical exit pupil, the semi-axis lengths of which differ from one another by at least 10%. Such a system is particularly well adapted to an anamorphically imaging projection lens system. With an elliptical configuration of the pupil facet mirror, an elliptical exit pupil of the illumination optical system can be particularly easily achieved.

The advantages of an optical system including an illumination optical system disclosed herein, as well as the advantages a projection exposure system including an illumination optical system as disclosed herein, correspond to those noted above with respect to the illumination optical system.

In some embodiments, a projection exposure system includes a reticle holder which can be displaced in a scanning direction to hold a reticle, wherein the imaging scale of the imaging optical system in a scanning direction is smaller than perpendicular thereto. For such a projection exposure system, the throughput loss in the scanning direction can be compensated completely by a higher scanning speed.

In some embodiments an illumination optical system has an elliptical pupil facet mirror and an elliptical exit pupil. The semi-axis lengths of the elliptical exit pupil differ from one another by at least 10%, and the semi-axis lengths of the elliptical pupil facet differ from one another by at least 10%. The imaging scale of such an imaging optical in the scanning direction is, in particular, at most half as great as perpendicular thereto. The ratio of the imaging scales in the scanning direction and perpendicular to this is, in particular, 1:2, 1:3, 1:4, 1:5, 1:6, 1:8, 1:10, 2:3, 2:5 or 3:4. The radiation source may be an EUV (Extreme Ultraviolet) light source, for example an LPP (Laser Produced Plasma) light source or a GDP (Gas Discharge Produced Plasma) light source.

A reticle, in which the critical dimension in the scanning direction differs from that perpendicular thereto, is particularly well suited for use with an anamorphically imaging projection optical system. Both the structures to be imaged on the reticle and the total size thereof are preferably configured in accordance with the different imaging scales in the scanning direction or perpendicular to this. In order to take into account the greater reduction, the reticle is configured correspondingly larger, in particular in the scanning direction.

The advantages of a production method and a component made using such a method correspond to those which have already been described above with reference to the projection exposure system according to the disclosure.

BRIEF DESCRIPTION OF THE DRAWINGS

Further advantages and details of the disclosure emerge from the description of a plurality of embodiments with the aid of the drawings, in which.

DETAILED DESCRIPTION

Figure 1:
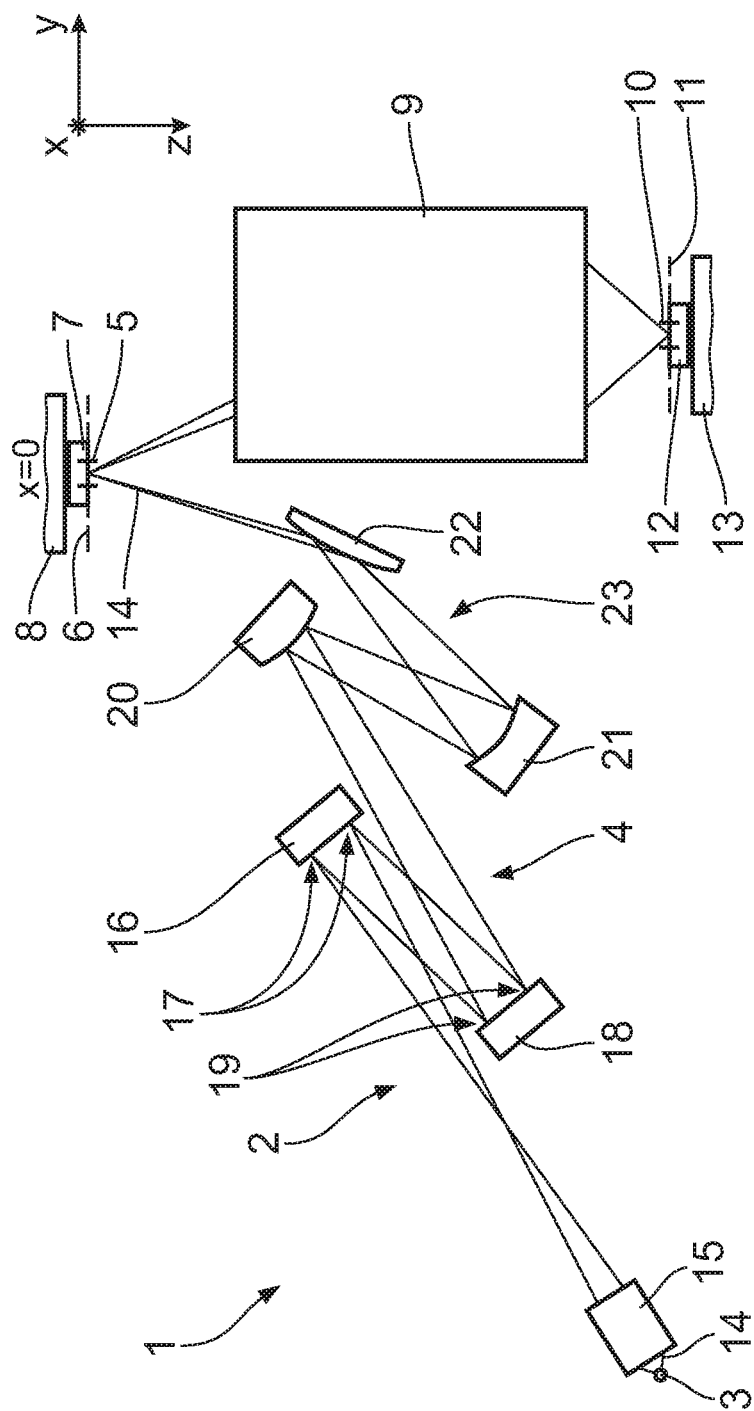
FIG. 1 schematically shows a meridional section through a projection exposure system for EUV lithography.

FIG. 1 schematically shows, in a meridional section, the components of a projection exposure system 1 for microlithography. An illumination system 2 of the projection exposure system 1, apart from a radiation source 3, includes an illumination optical system 4 for exposing an object field 5 in an object plane 6. A reticle 7, which is arranged in the object field 5 and is held by a reticle holder 8, only shown cutout-wise, is exposed here.

A projection optical system 9 indicated only schematically in FIG. 1 is used to image the object field 5 in an image field 10 in an image plane 11. The projection optical system 9 is therefore also designated an imaging optical system. A structure on the reticle 7 is imaged on a light-sensitive layer of a wafer 12 which is arranged in the region of the image field 10 in the image plane 11 and is held by a wafer holder 13 also shown schematically.

The radiation source 3 is an EUV radiation source which emits EUV radiation 14. The wavelength of the emitted useful radiation of the EUV radiation source 3 is in the range from 5 nm to 30 nm. Other wavelengths, which are used in lithography, and are available for suitable light sources, are also possible. The radiation source 3 may be a plasma source, for example a DPP source or an LPP source. A radiation source based on a synchrotron can also be used as the radiation source 3. Information on a radiation source of this type can be found by the person skilled in the art, for example, in U.S. Pat. No. 6,859,515 B2. A collector 15 is provided to bundle the EUV radiation 14 from the EUV radiation source 3.

The EUV radiation 14 is also designated illumination light or imaging light.

The illumination optical system 4 includes a field facet mirror 16 with a large number of field facets 17. The field facet mirror 16 is arranged in a plane of the illumination optical system 4, which is optically conjugated to the object plane 6. The EUV radiation 14 is reflected by the field facet mirror 16 to a pupil facet mirror 18 of the illumination optical system 4. The pupil facet mirror 18 has a large number of pupil facets 19. The field facets 17 of the field facet mirror 16 are imaged in the object field 5 with the aid of the pupil facet mirror 18.

For each field facet 17 on the field facet mirror 16, there is precisely one associated pupil facet 19 on the pupil facet mirror 18. Between a field facet 17 and a pupil facet 19, in each case, a light channel is configured. The facets 17, 19 of at least one of the facet mirrors 16, 18 may be switchable. For this purpose, a microelectromechanical system (MEMS) may be provided. The facets 17, 19 may, in particular, be tiltably arranged on the facet mirror 16, 18. It is possible here to only configure a part, for example at most 30%, at most 50% or at most 70% of the facets 17, 19 to be tiltable. It may also be provided that all the facets 17, 19 are tiltable. The switchable facets 17, 19 are, in particular, the field facets 17. By a tilting of the field facets 17, the allocation thereof to the respective pupil facets 19 and therefore the configuration of the light channels can be varied. For further details of the facet mirrors 16, 18 with tiltable facets 17, 19 and further details of the illumination optical system 4, reference is made to DE 10 2008 009 600 A1.

The illumination optical system 4 may also have further mirrors 20, 21 and 22, which form a transmission optical system 23. The last mirror 22 of the transmission optical system 23 is a grazing incidence mirror. The pupil facet mirror 18 and the transmission optical system 23 form a following optical system for transferring the illumination light 14 into the object field 5. The transmission optical system 23 can be dispensed with, in particular, when the pupil facet mirror 18 is arranged in an entry pupil of the projection optical system 9.

The illumination optical system 4 has an exit pupil with a shape adapted to (e.g., corresponding to) the shape of an entry pupil of the projection optical system 9. The exit pupil of the illumination optical system 4 is, in particular, elliptical. This can be achieved, in particular, by an elliptically configured pupil facet mirror 18. As an alternative to this, the pupil facets 19 can also be arranged on the pupil facet mirror 18 in such a way that they have an elliptically configured envelope.

The semi-axes of the elliptical pupil facet mirror 18 have, in particular, two different semi-axis lengths, the greater semi-axis length in particular being at least one and a half times as great, in particular at least twice as great, as the first semi-axis length. The semi-axis lengths are, in particular, in the ratio 1:2, 1:3, 1:4, 1:5, 1:6, 1:8, 1:10, 2:3, 2:5 or 3:4.

The semi-axes of the exit pupil of the illumination optical system 4 therefore have two different semi-axis lengths, the greater semi-axis length in particular being at least one and a half times as great, in particular at least twice as great, as the first semi-axis length. The semi-axis lengths are, in particular in the ratio 1:2, 1:3, 1:4, 1:5, 1:6, 1:8, 1:10, 2:3, 2:5 or 3:4.

For a simpler description of positional relationships, a Cartesian xyz-coordinate system is drawn in the figures, in each case. The x-axis in FIG. 1 runs perpendicular to the plane of the drawing and into it. The y-axis runs to the right. The z-axis runs downward. The object plane 6 and the image plane 11 both run parallel to the xy-plane.

The reticle holder 8 can be displaced in a controlled manner so that in the projection exposure system, the reticle 7 can be displaced in a displacement direction in the object plane 6. Accordingly, the wafer holder 13 can be displaced in a controlled manner so that the wafer 12 can be displaced in a displacement direction in the image plane 11. As a result, the reticle 7 can be scanned through the object field 5, and the wafer 12 can be scanned through the image field 10. The displacement direction in the figures is parallel to the y-direction. It will also be designated the scanning direction below. The displacement of the reticle 7 and the wafer 12 in the scanning direction can preferably take place synchronously with respect to one another.

Figure 2:
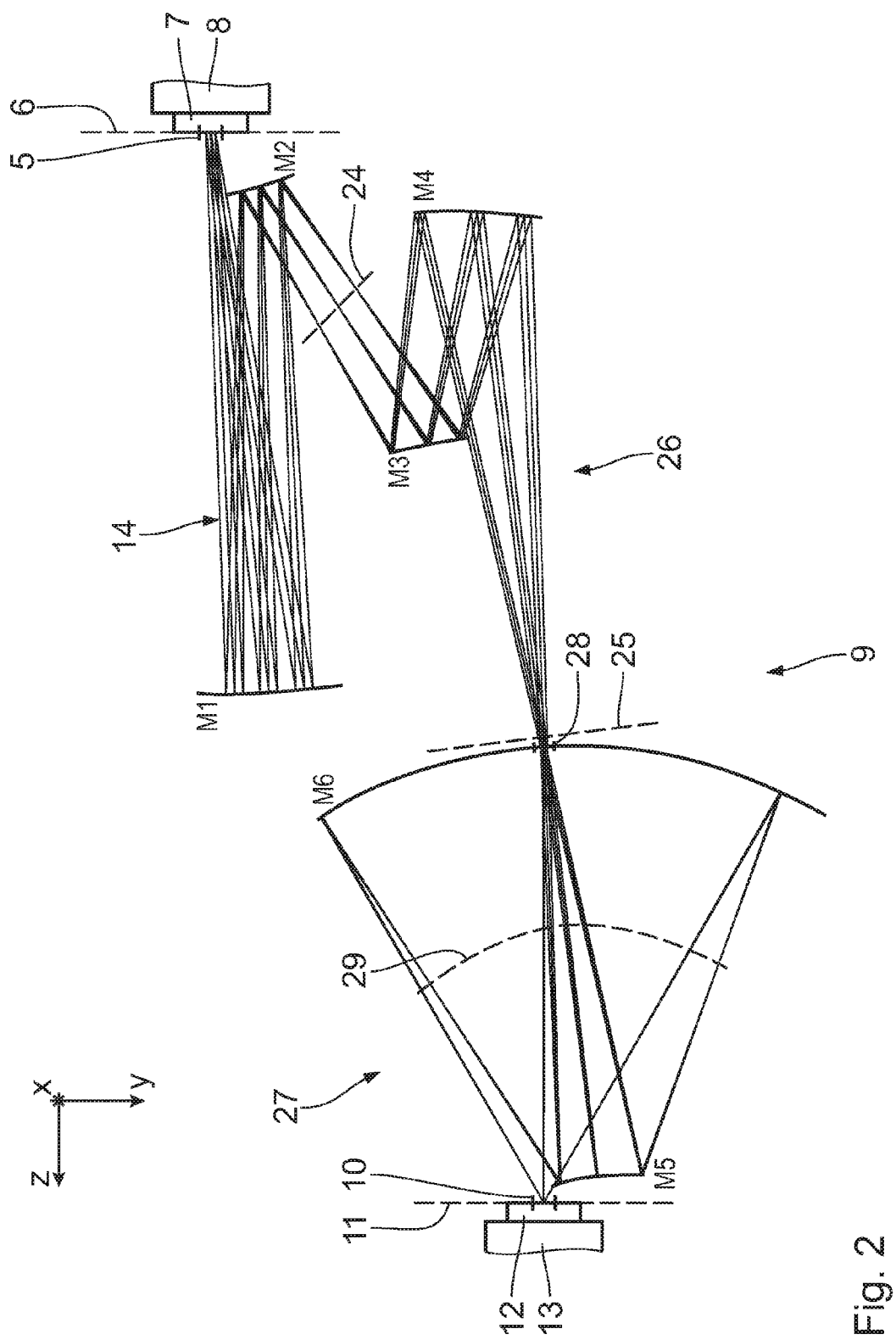
FIG. 2 schematically shows a cutout of the projection exposure system according to FIG. 1 to illustrate the beam path in the imaging optical system according to a first embodiment.
Figure 3:
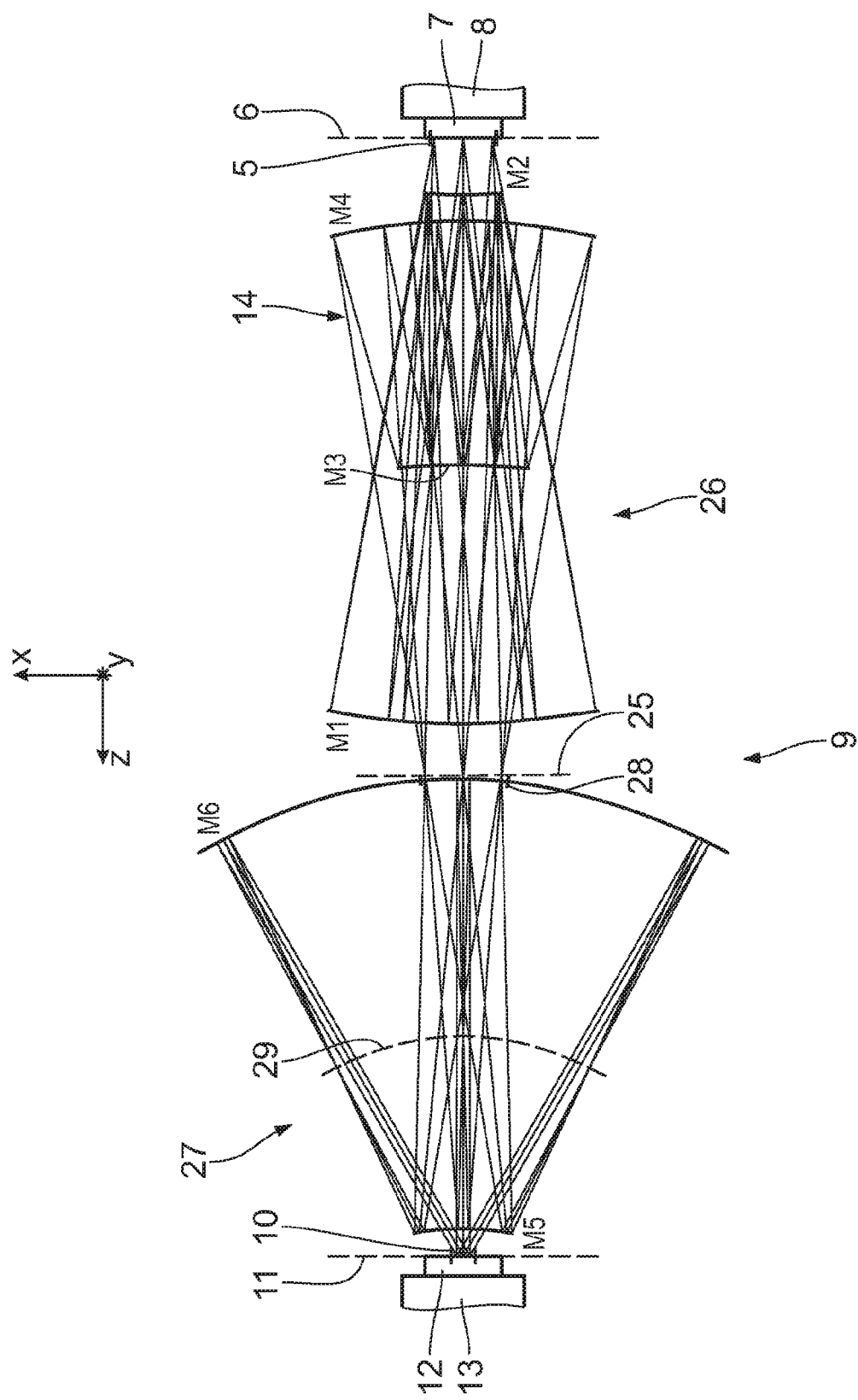
FIG. 3 shows a view in accordance with FIG. 2 in a plane perpendicular thereto.

FIGS. 2 and 3 show the optical design of a first configuration of the projection optical system 9. The beam path of individual beams of the radiation 14 extending from a central object field point and from two respective object field points defining the two opposing edges of the object field 5 are shown. The projection optical system 9 according to FIGS. 2 and 3 has a total of six mirrors, which are numbered consecutively M1 to M6 proceeding from the object field 5 in the direction of the beam path. The reflection faces of the mirrors M1 to M6 calculated in the design of the projection optical system 9 are shown in the figures. Only one section of the faces shown is partially actually used for the reflection of the radiation 14, as can be seen from the figures. The actual configuration of the mirrors M1 to M6, in other words, may be smaller than shown in the figures (the actual configuration may include only part of the calculated reflection face shown in the figures).

A pupil face 24 is located between the mirror M2 and the mirror M3. The pupil face 24 is not necessarily flat. It may be curved. Moreover, an intermediate image face 25 is located between the mirror M4 and the mirror M5. The intermediate image face 25 is not necessarily flat. It may be curved. The mirrors M1 to M4 therefore form a first part lens system 26. The mirrors M5 and M6 form a second part lens system 27.

The first part lens system 26 is an anamorphic lens, i.e. it images anamorphically. The second part lens system 27 is also an anamorphic lens, i.e. it images anamorphically. It is likewise possible, however, for the second part lens system 27 to be configured to be non-anamorphic.

At least one of the mirrors M1 to M6 is configured to be an anamorphically imaging optical element. The projection optical system 9 includes, in particular, at least one anamorphically imaging mirror, such as at least two anamorphically imaging mirrors, at least three anamorphically imaging mirrors, at least four anamorphically imaging mirrors, at least five anamorphically imaging mirrors, at least six anamorphically imaging mirrors, at least seven anamorphically imaging mirrors, at least eight anamorphically imaging mirrors.

The projection optical system 9 therefore has, in a first direction, a first imaging scale and, in a second direction, a second imaging scale which is different from this. The second imaging scale is, in particular, at least one and a half times as great, in particular at least twice as great, as the first imaging scale.

The projection optical system 9 is, in particular, configured so that the amount of the imaging scale in the scanning direction is smaller than the amount of the imaging scale in a direction perpendicular to the scanning direction. The amount of the imaging scale in the scanning direction is, in particular, at most three quarters as great (e.g., at most two thirds as great, at most half as great) as the imaging scale in a direction perpendicular to the scanning direction.

The projection optical system 9 has a direction-dependant object-side numerical aperture (NAO), i.e. the entry pupil deviates from the circular shape. The object-side numerical aperture (NAO) in a specific direction, namely in the direction of the large imaging scale, is in particular at least one and a half times as large (e.g., at least twice as large) as in a direction perpendicular thereto.

The mirror M6 has a through-opening 28 for radiation 14 to pass through. Located between the mirrors M5 and M6 is a further pupil face 29. The pupil face 29 is not necessarily flat. It may be curved.

The mirrors M1 to M6 are configured to reflect EUV radiation. They carry, in particular, multiple reflection layers for optimising their reflection for the impinging EUV illumination light 14. The reflection can be all the better optimised, the closer the impingement angle of the individual beams on the mirror surfaces to the perpendicular incidence.

The mirrors M1 to M5 have reflection faces, which are closed, in other words without a through-opening.

The mirrors M1, M4 and M6 have concave reflection faces. The mirrors M2, M3 and M5 have convex reflection faces.

The mirrors M1 to M6 of the projection optical system 9 are configured as freeform faces that cannot be described by a rotationally symmetrical function. Other configurations of the projection optical system 9 are also possible, in which at least one of the mirrors M1 to M6 has a freeform reflection face of this type. A freeform face of this type may be produced from a rotationally symmetrical reference face. Freeform faces of this type for reflection faces of the mirrors of projection optical systems of projection exposure systems for microlithography are known from US 2007-0058269 A1.

The freeform face can be mathematically described by the following equation:

$$Z(x, y) = \frac{cr^2}{1 + \sqrt{1 - (1+k)c^2r^2}} + \sum_{j=2}^{N} \frac{C_j}{N_{radius}^{m+n}} x^m y^n$$

wherein there applies:

$$j = \frac{(m+n)^2 + m + 3n}{2} + 1$$

Z is the arrow height of the freeform face at the point x, y, wherein $$x^2 + y^2 = r^2.$$

c is a constant, which corresponds to the summit of the curve of a corresponding asphere. k corresponds to a conical constant of a corresponding asphere. $C_j$ are the coefficients of the monomials $x^m y^n$. Typically, the values of c, k and $C_j$ are determined on the basis of the desired optical properties of the mirror within the projection optical system 9. $N_{radius}$ is a standardisation factor for the coefficients $C_j$. The order of the monomial, m+n, can be varied as desired. A higher order monomial can lead to a design of the projection optical system with better image error correction, but is, however, more complex to calculate. m+n can adopt values between 3 and more than 20.

Freeform faces can be mathematically described by Zernike polynomials, which, for example, are described in the manual of the optical design program CODE V®.

Alternatively, freeform faces can be described with the aid of two-dimensional spline surfaces. Examples of this are Bezier curves or non-uniform rational basis splines (NURBS). Two-dimensional spline surfaces may, for example, be described by a network of points in an xy-plane and associated z-values or by these points and gradients pertaining to them. Depending on the respective type of spline surface, the complete surface is obtained by interpolation between the network points using, for example, polynomials or functions, which have specific properties with regard to their continuity and differentiability. Examples of this are analytical functions.

Optical design data of the projection optical system 9 will be summarised below in tables, the data having been obtained with the aid of the optical design program Code V®.

The first of the following tables gives for the optical surfaces of the optical components and for the aperture stop, in each case, the reciprocal value of the summit of the curve (radius) and a thickness, which corresponds to the z-spacing of adjacent elements in the beam path, proceeding from the image plane 11, in other words counter to the light direction. The second table gives the coefficients $C_j$ of the monomials $x^m y^n$ in the freeform face equation given above for the mirrors M1 to M6.

In a further table, the amount in mm is also given, along which the respective mirror, proceeding from a mirror reference design was decentred (Y-decentre) and rotated (X-rotation). This corresponds to a parallel displacement and a tilting in the freeform face design method. The displacement takes place in the y-direction here and the titling is about the x-axis. The angle of rotation is given here in degrees.

| Surface | Radius | Thickness | Operating mode |
|---|---|---|---|
| image plane | INFINITE | 852.884 | |
| M6 | −889.919 | −802.884 | REFL |
| M5 | −219.761 | 1800.787 | REFL |
| M4 | −999.946 | −434.619 | REFL |
| M3 | −1033.356 | 483.832 | REFL |
| M2 | 2464.083 | −947.116 | REFL |
| M1 | 1323.688 | 1047.116 | REFL |
| object plane | INFINITE | 0.000 | |

| Coefficient | M6 | M5 | M4 |
|---|---|---|---|
| K | 3.303831E−03 | 2.041437E−02 | −1.056546E−01 |
| Y | 0.000000E+00 | 0.000000E+00 | 0.000000E+00 |
| X2 | 1.106645E+00 | 4.620513E+00 | 1.065419E+00 |
| Y2 | 1.316656E+00 | 4.632819E+00 | 2.089523E+00 |
| X2Y | −6.987016E−02 | 6.244905E−02 | 2.322141E−01 |
| Y3 | −1.544816E−01 | −2.303227E−01 | −2.158981E−01 |
| X4 | 3.297744E−02 | 9.371547E−02 | 7.579352E−02 |
| X2Y2 | 6.476911E−02 | 1.671737E−01 | 8.744751E−02 |
| Y4 | 5.431530E−02 | 7.743085E−02 | 2.360575E−01 |
| X4Y | −7.040479E−04 | 4.607809E−03 | 3.961681E−03 |
| X2Y3 | −6.159827E−03 | −1.034287E−02 | 9.782459E−03 |
| Y5 | −4.061987E−03 | −3.840440E−03 | −1.297054E−01 |
| X6 | 1.398226E−03 | 3.085471E−03 | 6.847894E−03 |
| X4Y2 | 2.977799E−03 | 8.906352E−03 | 6.372742E−03 |
| X2Y4 | 4.433992E−03 | 8.678073E−03 | −2.569810E−02 |
| Y6 | 1.255594E−03 | 1.683572E−03 | 9.106731E−02 |
| X6Y | 2.969767E−04 | 1.881484E−04 | 1.342374E−03 |
| X4Y3 | −2.820109E−04 | −1.123168E−03 | −5.896992E−03 |
| X2Y5 | −3.654895E−04 | −5.949903E−04 | 1.660704E−03 |
| Y7 | 8.966891E−05 | −3.952323E−04 | −3.764049E−02 |
| Nradius | 2.899772E+02 | 6.300046E+01 | 2.064580E+02 |

| Coefficient | M3 | M2 | M1 |
|---|---|---|---|
| K | 5.744686E−01 | −3.325393E+02 | −1.583030E−02 |
| Y | 0.000000E+00 | 0.000000E+00 | 0.000000E+00 |
| X2 | 3.551408E−01 | 3.277030E−01 | −2.811984E−02 |

-continued

| Coefficient | M3 | M2 | M1 |
|---|---|---|---|
| Y2 | 2.123536E+00 | 1.609563E+00 | −4.135835E−01 |
| X2Y | 2.013521E−01 | −6.948142E−01 | −3.866470E−02 |
| Y3 | −1.210907E−02 | 3.694447E−01 | −1.853273E−02 |
| X4 | 5.478320E−02 | 1.369729E−01 | 1.349339E−03 |
| X2Y2 | 7.482002E−02 | 1.984843E−01 | 3.032808E−03 |
| Y4 | 8.327949E−02 | −1.227576E−01 | −2.824781 E−03 |
| X4Y | −2.048831E−03 | −4.568931E−02 | −4.300195E−04 |
| X2Y3 | −4.029059E−03 | −1.713508E−02 | −6.501645E−04 |
| Y5 | −1.415756E−02 | 6.185385E−03 | 3.144628E−03 |
| X6 | 1.998416E−04 | −1.834856E−02 | 6.906841E−05 |
| X4Y2 | −1.979383E−03 | −3.309794E−02 | 5.274081E−05 |
| X2Y4 | −5.943296E−03 | −5.169942E−02 | −1.330272E−03 |
| Y6 | 1.246118E−03 | −1.603819E−01 | −1.363317E−02 |
| X6Y | 1.584327E−04 | 7.876367E−03 | −2.377257E−05 |
| X4Y3 | −3.187207E−04 | −1.244804E−02 | −2.251271E−04 |
| X2Y5 | −5.566691E−04 | −5.746055E−02 | −9.996573E−04 |
| Y7 | −1.399787E−03 | −3.870909E−02 | 4.001012E−03 |
| Nradius | 8.132829E+01 | 7.472082E+01 | 1.311311E+02 |

| Coefficient | M6 | M5 | M4 | M3 | M2 | M1 | Image plane |
|---|---|---|---|---|---|---|---|
| Y-decentre | −51.252 | −99.408 | 123.654 | 215.631 | 528.818 | 512.855 | 0.000 |
| X-rotation | 0.323 | 7.067 | −2.444 | 10.483 | 16.940 | 3.488 | 0.000 |

The projection optical system 9, in the y-direction, i.e. in the scanning direction, has an imaging scale of 1:8, i.e., the reticle 7 in the object field 5, in the scanning direction, is eight times as great as its image in the image field 10. The projection optical system 9, in the x-direction, i.e. perpendicular to the scanning direction, has an imaging scale of 1:4. The projection optical system 9 is therefore reducing. An image-side numerical aperture of the projection optical system 9 is 0.5. The image-side numerical aperture of the projection optical system 9 is, in particular, at least 0.4. The image field 10 has a size of 2 mm×26 mm, wherein the 2 mm is in the scanning direction and the 26 mm is perpendicular to the scanning direction. In particular in the scanning direction, the image field 10 may also have a different size. The size of the image field 10 is at least 1 mm×10 mm. Perpendicular to the scanning direction, the image field 10, in particular, has a width of more than 13 mm. The image field 10 is, in particular, rectangular. The projection optical system 9, in particular, has an image-side scanning slot width of at least 13 mm, in particular more than 13 mm, in particular at least 26 mm. The projection optical system 9 has an object-side main beam angle for the field centre point of 6°. The object-side main beam angle for the field centre point is, in particular at most 7°. It has an optical overall length of 2000 mm.

The object field 5 in this embodiment has a size of 16 mm×104 mm. In this case, the 16 mm is in the scanning direction and the 104 mm is perpendicular to the scanning direction.

The reticle 7 is also adapted to the different imaging scales in the scanning direction and perpendicular thereto. It has structures with different minimal structure sizes in the scanning direction and in the direction perpendicular thereto. The structures on the reticle 7 may have, in the scanning direction and in the direction perpendicular to this, in particular, dimensions, which are, in each case, an integral multiple of these minimal structure sizes. The ratio of the minimal structure sizes in the scanning direction and perpendicular to this is precisely inversely proportional to the ratio of the imaging scales in these directions. The minimal structure sizes in the scanning direction and perpendicular to this differ, in particular, by at least 10%, in particular at least 20%, in particular at least 50% from one another.

The reticle 7 has a width in the direction perpendicular to the scanning direction of at least 104 mm. The reticle 7, in particular, has a length adapted to the stronger reduction in the scanning direction. The reticle 7 has, in particular, a width of 104 mm and a length of 264 mm. The length of the reticle is, in particular, greater than 132 mm. It is, in particular, at least 140 mm, in particular at least 165 mm, in particular at least 198 mm.

Figure 4:
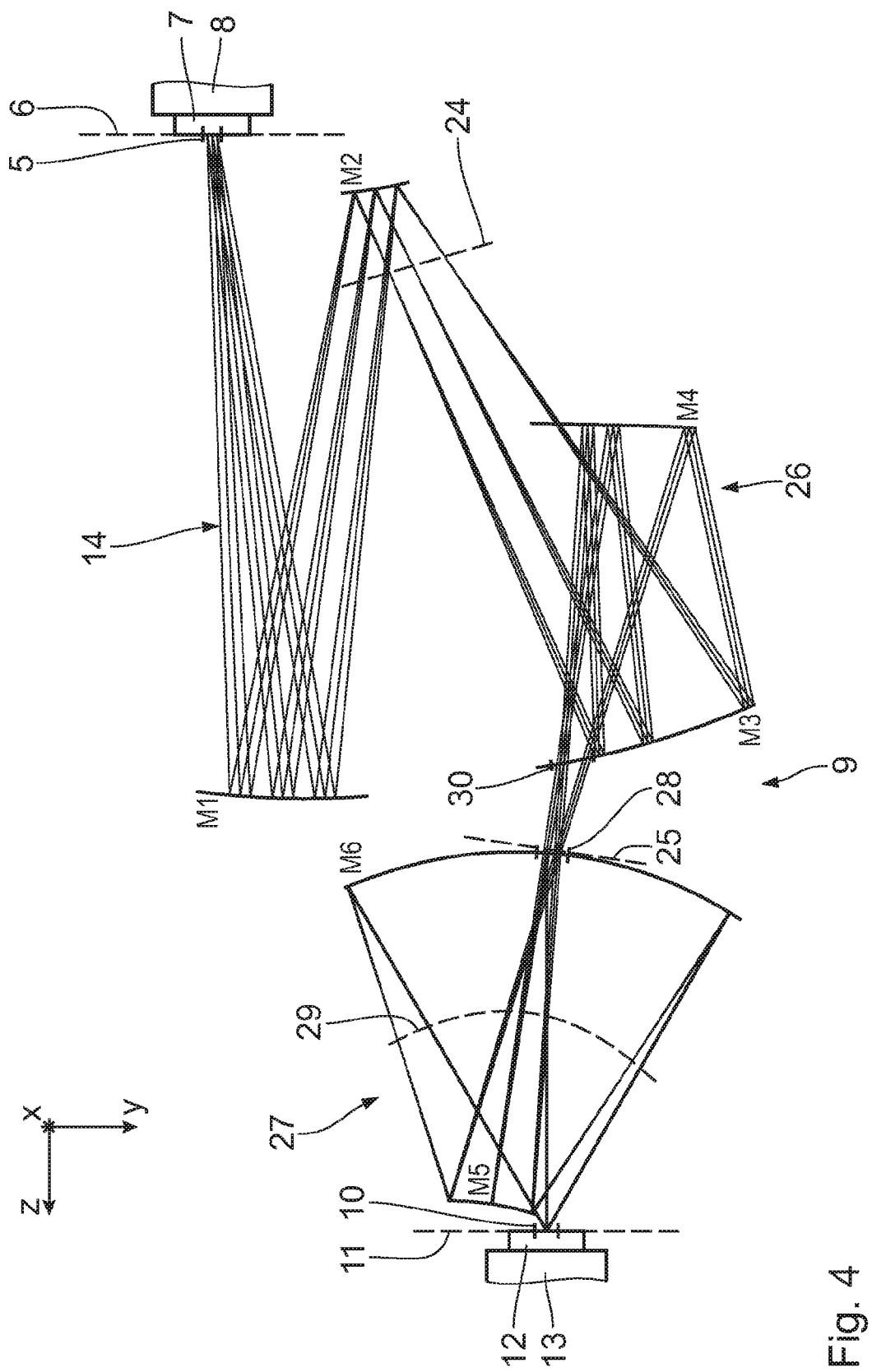
FIGS. 4 and 5 show views according to FIGS. 2 and 3 of a further embodiment.
Figure 5:
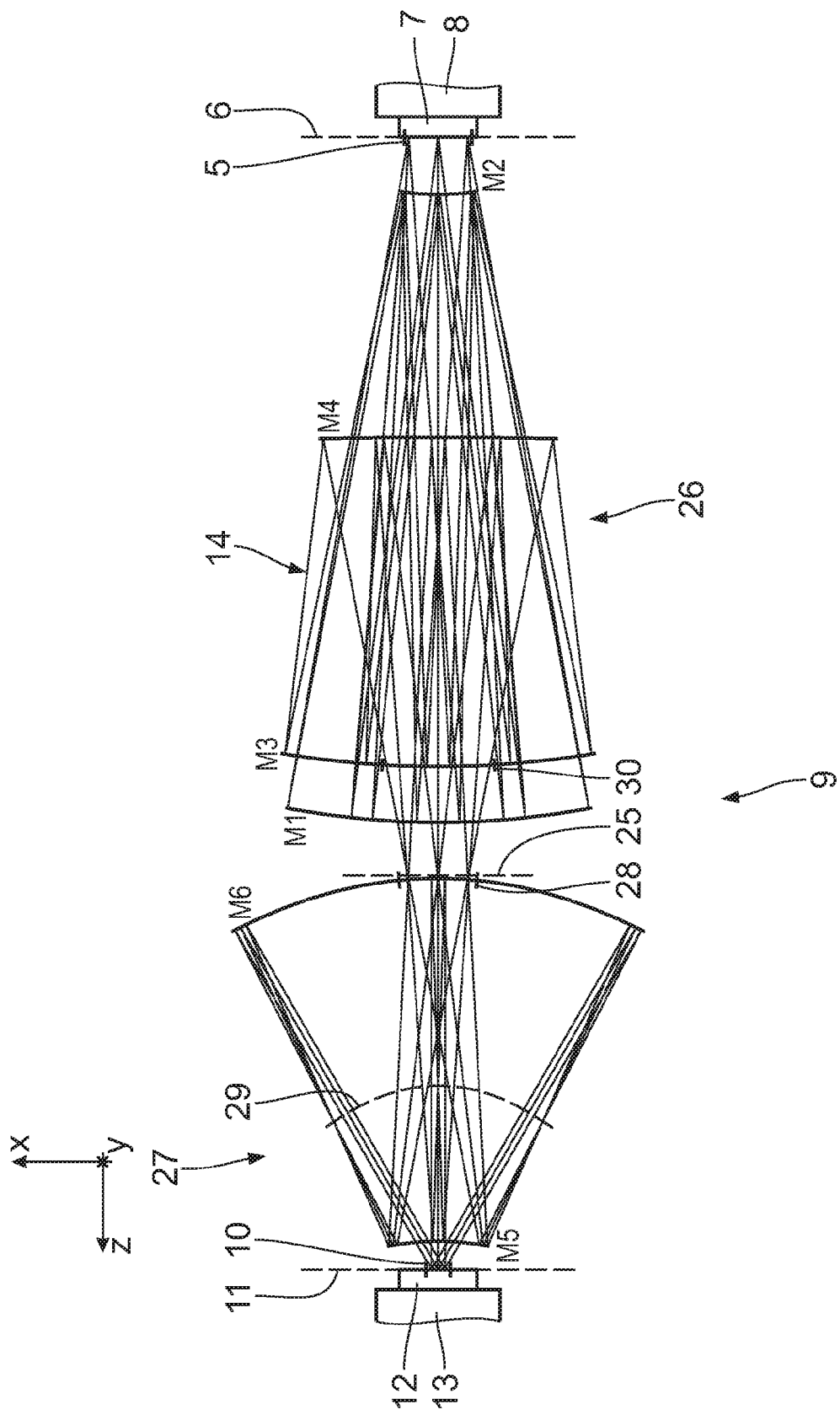

A further configuration of the projection optical system 9, which can be used in the projection exposure system 1, is shown in FIGS. 4 and 5. Components which correspond to those which have already been described above with reference to FIGS. 2 and 3 have the same reference numerals and will not be discussed again in detail.

The mirror M3 has no through-opening in the optically used region. However, the mechanical configuration of the mirror M3 may be selected such that the light, which runs from the mirror M4 to the mirror M5, passes through a mirror opening of the monolithically configured mirror body of M3.

The mirrors M1, M3, M4 and M6 have concave reflection faces. The mirrors M2 and M5 have convex reflection faces.

In this embodiment, the beam path between the mirrors M2 and M3 intersects with the beam path between the mirrors M4 and M5.

In this embodiment, the mirror M5, relative to the image field 10 in the scanning direction, is arranged on the same side as the object field 5.

The optical design data of the projection optical system 9 according to FIGS. 4 and 5 will in turn be summarised in tables below. The mathematical description of the freeform faces corresponds to that which has already been described above with reference to the configurations according to FIGS. 2 and 3. The structure of the tables with respect to the configuration according to FIGS. 4 and 5 also corresponds to that with respect to the configuration according to FIGS. 2 and 3.

| Surface | Radius | Thickness | Operating mode |
|---|---|---|---|
| image plane | INFINITE | 689.272 | |
| M6 | −731.552 | −639.272 | REFL |
| M5 | −241.671 | 1420.179 | REFL |
| M4 | −1500.000 | −580.907 | REFL |
| M3 | 1422.356 | 1010.728 | REFL |
| M2 | 661.083 | −1110.728 | REFL |
| M1 | 1384.311 | 1210.728 | REFL |
| object plane | INFINITE | 0.000 | |

| Coefficient | M6 | M5 | M4 |
|---|---|---|---|
| K | 0.000000E+00 | 0.000000E+00 | 0.000000E+00 |
| Y | 0.000000E+00 | 0.000000E+00 | 0.000000E+00 |
| X2 | 1.697113E+00 | 4.496118E+00 | 1.030719E+01 |

-continued

| Coefficient | M6 | M5 | M4 |
|---|---|---|---|
| Y2 | 1.683950E+00 | 4.083378E+00 | 1.147196E+01 |
| X2Y | 1.755515E−01 | −3.170399E−01 | −1.434807E+00 |
| Y3 | 2.279761E−02 | 9.028788E−02 | 1.085004E+00 |
| X4 | 5.443962E−02 | 4.335109E−02 | 2.308628E−01 |
| X2Y2 | 1.503579E−01 | 8.531612E−02 | 7.598943E−01 |
| Y4 | 5.203904E−02 | 6.130679E−02 | 2.980202E−01 |
| X4Y | 5.039890E−03 | −1.771794E−02 | −8.711086E−03 |
| X2Y3 | 8.907227E−03 | −1.404665E−02 | 8.302498E−04 |
| Y5 | 5.015844E−03 | 8.045746E−03 | 4.101109E−02 |
| Nradius | 2.899772E+02 | 6.300046E+01 | 2.064580E+02 |

| Coefficient | M3 | M2 | M1 |
|---|---|---|---|
| K | 0.000000E+00 | 0.000000E+00 | 0.000000E+00 |
| Y | 0.000000E+00 | 0.000000E+00 | 0.000000E+00 |
| X2 | −4.645076E−01 | −5.243755E−01 | −3.303400E−01 |
| Y2 | −2.057326E−01 | −2.274245E−02 | −7.527525E−01 |
| X2Y | −3.583366E−02 | 1.523089E+00 | −2.593623E−03 |
| Y3 | 3.371920E−02 | −2.167244E+00 | −3.182409E−02 |
| X4 | 9.534050E−05 | 7.127442E−02 | −8.002659E−04 |
| X2Y2 | 4.301563E−03 | −3.064519E−01 | −5.376311E−03 |
| Y4 | −9.145920E−04 | 7.458445E−01 | −7.154305E−03 |
| X4Y | 9.453851E−05 | 1.770844E−01 | −2.938545E−04 |
| X2Y3 | −2.757417E−04 | 2.079536E−01 | 2.101675E−03 |
| Y5 | 4.683904E−05 | −1.544216E−01 | 6.098608E−04 |
| Nradius | 8.132829E+01 | 7.472082E+01 | 1.311311E+02 |

| Coefficient | M6 | M5 | M4 | M3 | M2 | M1 | Image plane |
|---|---|---|---|---|---|---|---|
| Y-decentre | 0.000 | 99.374 | −121.476 | −185.579 | 311.769 | 482.388 | 0.000 |
| X-rotation | −4.418 | −8.837 | −1.271 | 16.249 | 8.734 | −1.361 | 0.000 |

Figure 6:
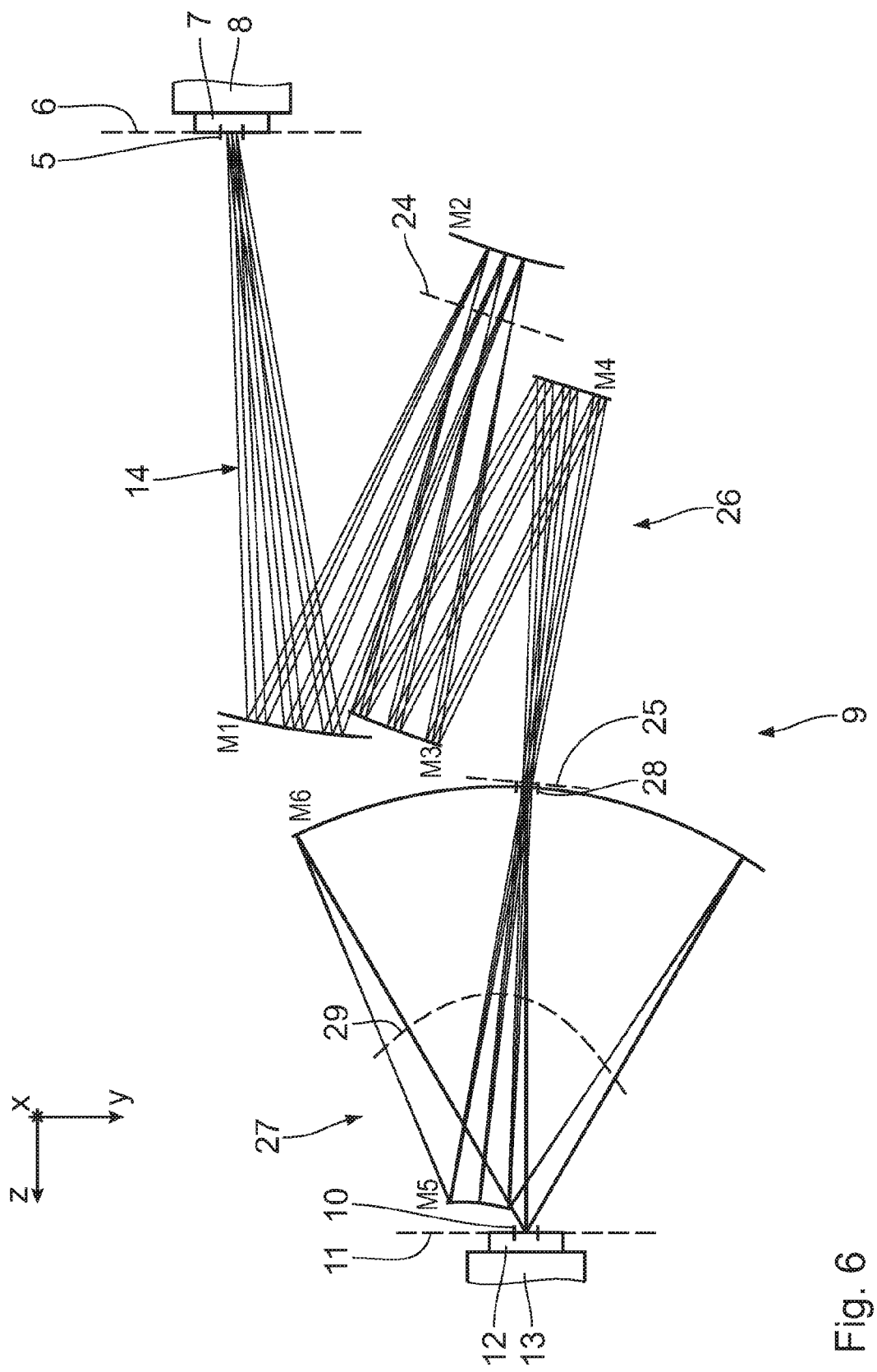
FIGS. 6 and 7 show corresponding views of a third embodiment.
Figure 7:
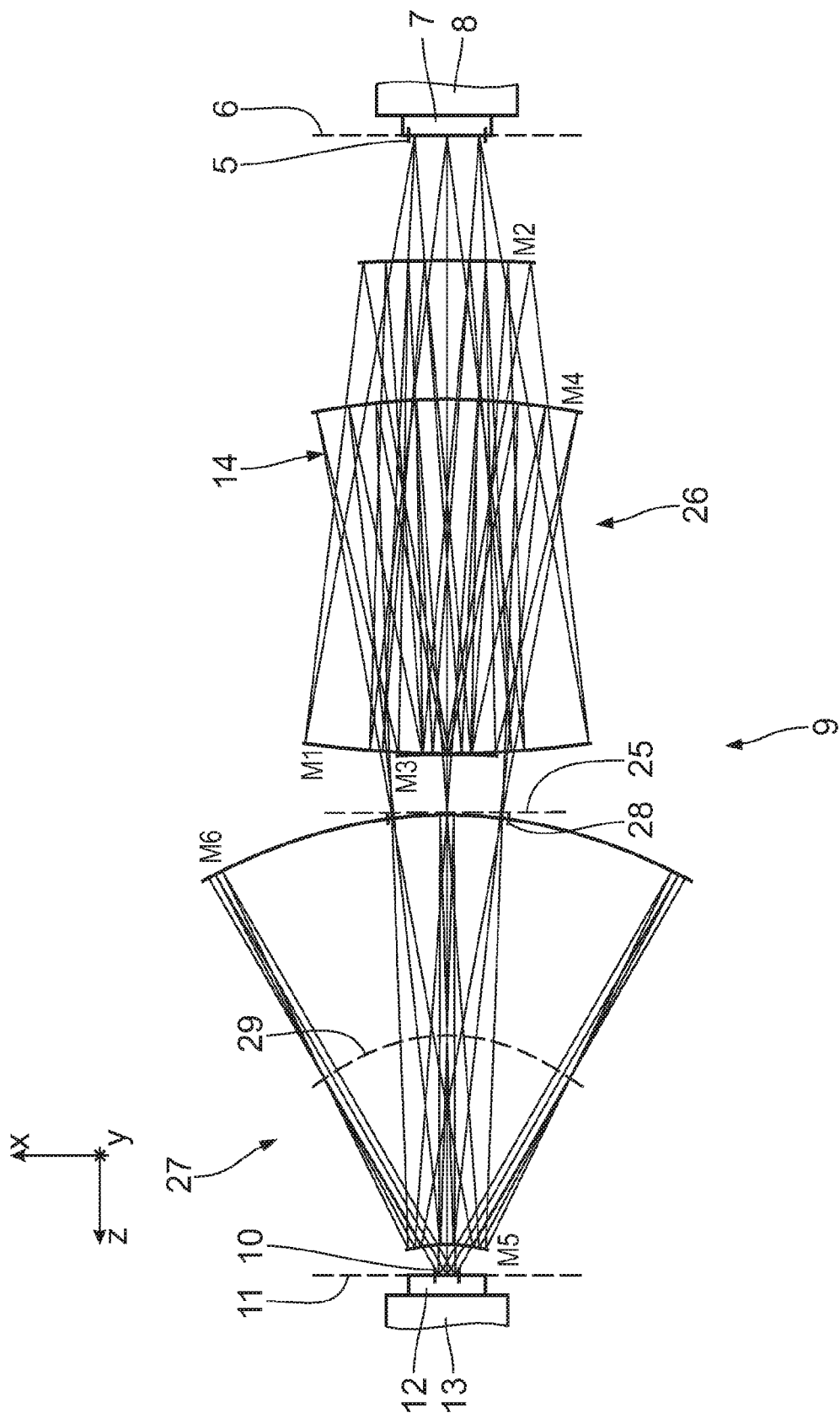

FIGS. 6 and 7 show a further design of the projection optical system 9, which can be used in the projection exposure system 1. Components which correspond to those which have already been described above with reference to FIGS. 2 and 3 have the same reference numerals will not be discussed again in detail.

The projection optical system 9 according to FIGS. 6 and 7 has a total of six mirrors M1 to M6, which are numbered consecutively M1 to M6 in the direction of the beam path proceeding from the object field 5. The projection optical system 9 according to FIGS. 6 and 7 has an optical overall length of 1865 mm.

The mirrors M1, M4 and M6 have a concave reflection face. The mirror M5 has a convex reflection face. The mirrors M2 and M3 are convex in one direction and concave in the orthogonal direction with respect thereto, in other words have the form of a saddle face in the centre point of the mirror.

The mirror M5 is also arranged in this embodiment, in the scanning direction with respect to the image field 10, on the same side as the object field 5.

The optical design data of the projection optical system 9 according to FIGS. 6 and 7 will in turn be shown in tables below. The mathematical description of the freeform faces corresponds to that which was already described above with reference to the configuration according to FIGS. 2 and 3. The structure of the tables with respect to the configuration according to FIGS. 6 and 7 also corresponds to that with respect to the configuration according to FIGS. 2 and 3.

| Surface | Radius | Thickness | Operating mode |
|---|---|---|---|
| image plane | INFINITE | 752.663 | |
| M6 | −770.716 | −702.663 | REFL |
| M5 | −150.912 | 1382.613 | REFL |
| M4 | −996.191 | −579.950 | REFL |
| M3 | −3722.693 | 805.250 | REFL |
| M2 | −19143.068 | −805.250 | REFL |
| M1 | 1526.626 | 1011.848 | REFL |
| object plane | INFINITE | 0.000 | |

| Coefficient | M6 | M5 | M4 |
|---|---|---|---|
| K | 0.000000E+00 | 0.000000E+00 | 0.000000E+00 |
| Y | 0.000000E+00 | 0.000000E+00 | 0.000000E+00 |
| X2 | 1.014388E+00 | 5.967807E+00 | 1.640439E+00 |
| Y2 | 9.176806E−01 | 5.297172E+00 | 1.185698E+01 |
| X2Y | 2.666213E−02 | −2.932506E−02 | −5.795084E−01 |
| Y3 | 1.276213E−02 | −1.747940E−01 | 2.665088E−01 |
| X4 | 3.194237E−02 | 1.741906E−01 | 4.142971E−02 |
| X2Y2 | 5.891573E−02 | 4.136465E−01 | −2.431409E−02 |
| Y4 | 2.892148E−02 | 1.408837E−01 | 8.604418E−01 |

-continued

| Coefficient | M6 | M5 | M4 |
|---|---|---|---|
| X4Y | 5.053354E−04 | 8.947414E−03 | 1.339774E−03 |
| X2Y3 | 3.013407E−03 | 4.414092E−02 | −2.210148E−02 |
| Y5 | 2.088577E−03 | 3.281648E−02 | −1.242199E+00 |
| Nradius | 2.899772E+02 | 6.300046E+01 | 2.064580E+02 |

| Coefficient | M3 | M2 | M1 |
|---|---|---|---|
| K | 0.000000E+00 | 0.000000E+00 | 0.000000E+00 |
| Y | 0.000000E+00 | 0.000000E+00 | 0.000000E+00 |
| X2 | −3.018727E+00 | −4.089101E−01 | −1.333076E−01 |
| Y2 | 2.571222E+00 | 3.746969E+00 | 8.408741E−01 |
| X2Y | −2.111739E−01 | −1.877269E−01 | 3.355099E−02 |
| Y3 | −1.035192E−03 | −1.810657E−01 | −3.518765E−03 |
| X4 | −9.587021E−05 | −1.882449E−03 | 2.861048E−03 |
| X2Y2 | −2.154549E−02 | 8.492037E−02 | 3.127905E−02 |
| Y4 | 1.331548E−02 | −4.386749E−01 | 7.200871E−03 |
| X4Y | 3.718201E−03 | −6.344503E−03 | −2.655046E−04 |
| X2Y3 | 4.305507E−03 | −1.265202E−01 | −6.358900E−03 |
| Y5 | −5.587835E−03 | −6.311675E−01 | −1.276179E−02 |
| Nradius | 8.132829E+01 | 7.472082E+01 | 1.311311E+02 |

| Coefficient | M6 | M5 | M4 | M3 | M2 | M1 | Image plane |
|---|---|---|---|---|---|---|---|
| Y-decentre | −11.861 | 78.940 | −76.134 | 224.849 | 34.161 | 393.420 | 0.000 |
| X-rotation | −4.070 | −6.401 | −16.914 | −20.375 | −18.683 | −9.044 | 0.000 |

Figure 8:
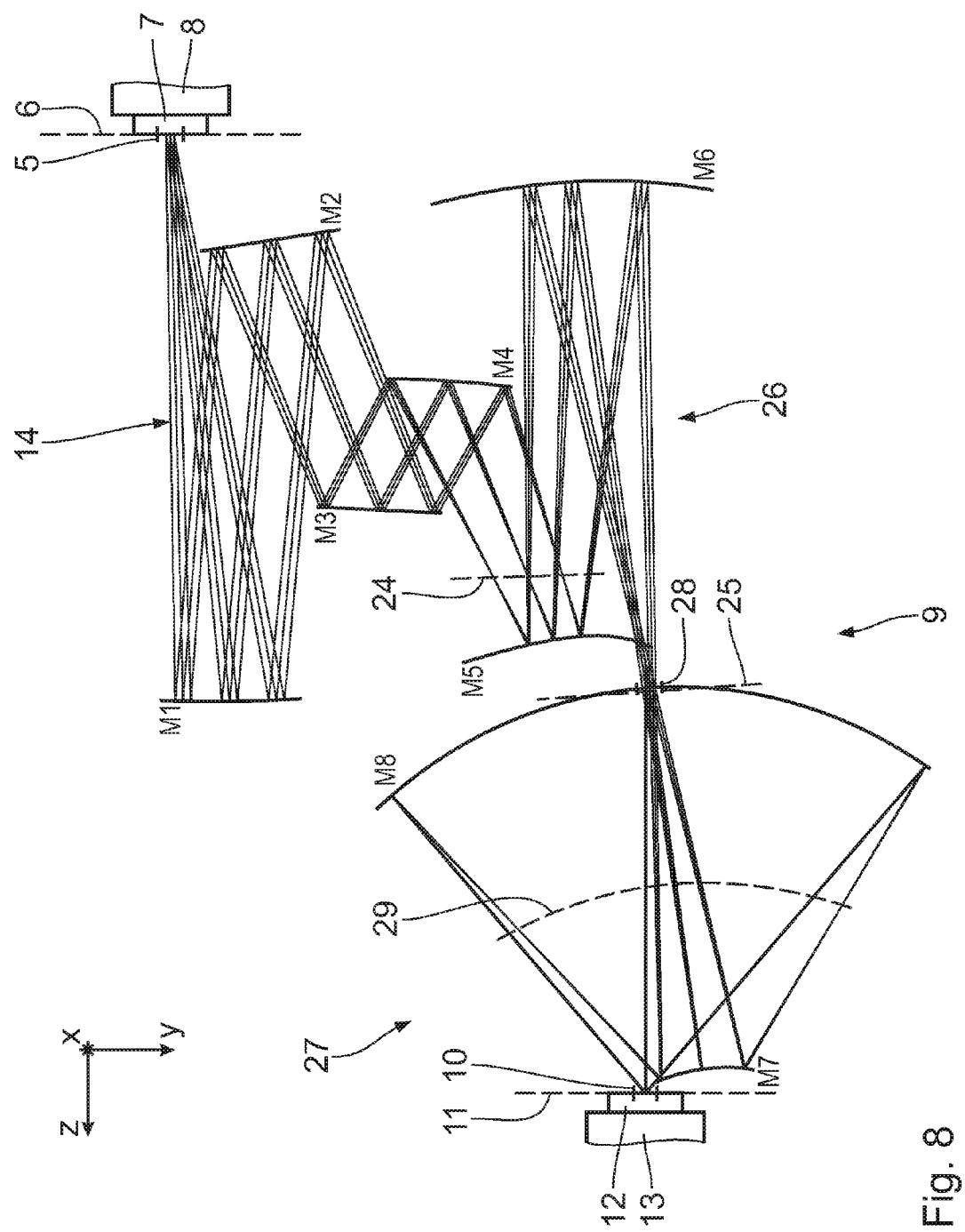
FIGS. 8 and 9 show corresponding views of a fourth embodiment.
Figure 9:
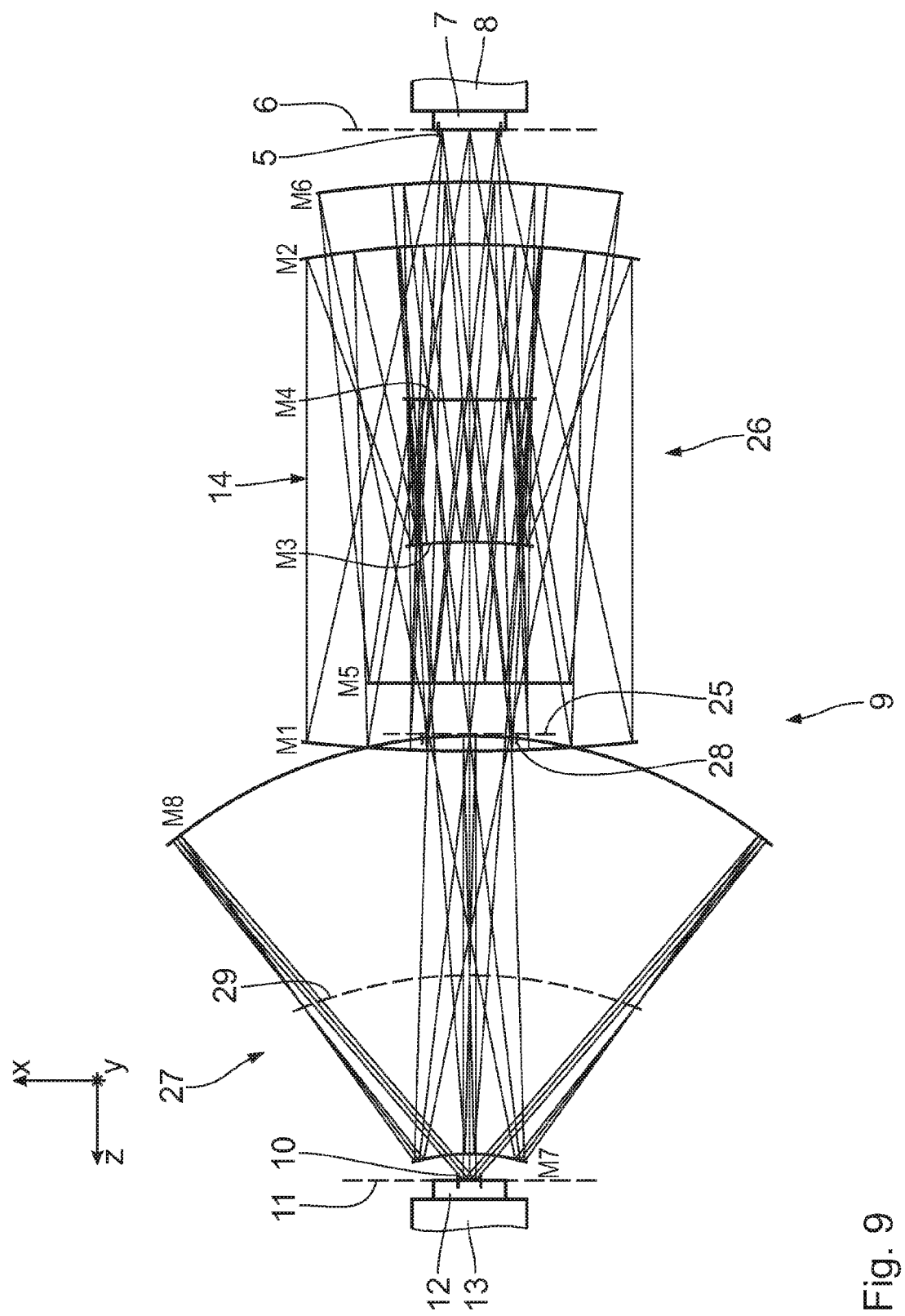

FIGS. 8 and 9 show a further configuration of a projection optical system 9, which can be used in the projection exposure system 1. Components which correspond to those which have already been described above with reference to FIGS. 2 and 3 have the same reference numerals and will not be discussed again in detail.

The projection optical system 9 according to FIGS. 8 and 9 has eight mirrors M1 to M8. The mirrors M1 to M6 form the first part lens system 26. The mirrors M7 and M8 form the second part lens system 27. The mirror M8, within the optical useful region, has the through-opening 28 for imaging light to pass through. The mirrors M1 to M7 have reflection faces, which are closed, in other words without a through-opening within the optical useful region. The projection optical system 9 according to FIGS. 8 and 9 therefore has precisely one mirror with a through-opening 28 within the optical useful region. Obviously, it is also possible to configure a projection optical system 9 with eight mirrors M1 to M8, of which more than one has a through-opening within the optical useful region.

The pupil face 24 is located in the beam path between the mirrors M3 and M5. The pupil face 29 is located between the mirrors M7 and M8. The projection optical system 9 according to FIGS. 8 and 9 also has two part lens systems 26, 27. It produces precisely one intermediate image, which lies geometrically in the region of the through-opening of the mirror M8.

The mirrors M1, M2, M6 and M8 have a concave reflection face. The mirror M7 has a convex reflection face.

The projection optical system according to FIGS. 8 and 9 has an image-side numerical aperture of 0.65. The optical design data of the projection optical system 9 according to FIGS. 8 and 9 are summarised below in tables as in the preceding examples.

| Surface | Radius | Thickness | Operating mode |
|---|---|---|---|
| image plane | INFINITE | 845.498 | |
| M8 | −876.024 | −795.498 | REFL |
| M7 | −180.463 | 1850.000 | REFL |
| M6 | −1124.587 | −954.502 | REFL |
| M5 | −488.461 | 539.347 | REFL |
| M4 | −385.935 | −268.946 | REFL |
| M3 | −899.608 | 563.864 | REFL |
| M2 | −1862.135 | −962.532 | REFL |
| M1 | −5181.887 | 1182.769 | REFL |
| object plane | INFINITE | 0.000 | |

| Coefficient | M8 | M7 | M6 | M5 |
|---|---|---|---|---|
| K | 0.000000E+00 | 0.000000E+00 | 0.000000E+00 | 0.000000E+00 |
| Y | 0.000000E+00 | 0.000000E+00 | 0.000000E+00 | 0.000000E+00 |
| X2 | 3.488069E+00 | 1.173931E+01 | 2.308119E+01 | 1.973785E+01 |
| Y2 | 2.635738E+00 | 1.010579E+01 | 9.438034E+00 | 5.768532E+00 |
| X2Y | −3.059528E−01 | −2.733318E−01 | −2.266607E+00 | −2.615013E+00 |
| Y3 | 4.818868E−03 | 6.423471E−01 | 4.511519E−01 | 3.223897E+00 |
| X4 | 1.179868E−01 | 5.618198E−01 | 1.276169E+00 | 3.423570E−01 |
| X2Y2 | 3.744431E−01 | 9.722072E−01 | 1.994073E+00 | 1.253707E+00 |
| Y4 | 1.874806E−01 | 5.624878E−01 | 9.258956E−01 | 1.143661E+00 |
| X4Y | 4.142568E−03 | 7.747318E−03 | −2.207925E−01 | 2.696457E−02 |
| X2Y3 | −2.457062E−02 | 2.657340E−02 | −4.677376E−02 | 1.053608E−01 |
| Y5 | −1.021381E−02 | −2.031996E−02 | 3.450492E−01 | 1.716687E+00 |
| X6 | 1.995975E−02 | 5.531407E−02 | 1.199126E−01 | 1.472679E−02 |
| X4Y2 | 4.538384E−02 | 1.603998E−01 | 2.637967E−01 | 4.745154E−02 |
| X2Y4 | 5.093101E−02 | 1.653739E−01 | 3.269947E−01 | 4.959237E−01 |
| Y6 | 1.573648E−02 | 6.733509E−02 | −1.107783E−01 | −1.594589E+00 |
| X6Y | −4.813461E−03 | 1.089425E−03 | −8.010947E−02 | −1.168696E−04 |
| X4Y3 | −6.317680E−03 | −3.797390E−03 | −4.398398E−03 | 1.681727E−02 |
| X2Y5 | −4.665516E−03 | −6.378254E−03 | 1.634222E−02 | −8.741752E−01 |
| Y7 | −1.452902E−03 | 1.323361E−03 | −8.378471E−01 | −2.083305E−01 |
| X8 | 2.243101E−03 | 8.933777E−03 | −9.452801E−03 | 8.039655E−04 |
| X6Y2 | 1.043837E−02 | 3.095089E−02 | 9.332196E−02 | 5.834641E−03 |
| X4Y4 | 1.610588E−02 | 4.686597E−02 | 1.032458E−01 | −1.262475E−01 |
| X2Y6 | 1.112924E−02 | 3.372176E−02 | −1.634446E−01 | −2.791598E−01 |
| Y8 | 2.847098E−03 | 9.333073E−03 | −6.596064E−01 | 3.828685E−01 |
| X8Y | 0.000000E+00 | 0.000000E+00 | 0.000000E+00 | 0.000000E+00 |
| X6Y3 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 |
| Y9 | 0.000000E+00 | 0.000000E+00 | 0.000000E+00 | 0.000000E+00 |
| X10 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 |
| Y10 | 0.000000E+00 | 0.000000E+00 | 0.000000E+00 | 0.000000E+00 |
| Nradius | 4.270420E+02 | 8.460702E+01 | 3.587547E+02 | 1.359154E+02 |

| Coefficient | M4 | M3 | M2 | M1 |
|---|---|---|---|---|
| K | 0.000000E+00 | 0.000000E+00 | 0.000000E+00 | 0.000000E+00 |
| Y | 0.000000E+00 | 0.000000E+00 | 0.000000E+00 | 0.000000E+00 |

-continued

| Coefficient | M4 | M3 | M2 | M1 |
|---|---|---|---|---|
| X2 | 7.762408E+00 | 0.000000E+00 | 0.000000E+00 | 2.415351E+01 |
| Y2 | 5.991623E+00 | 2.100665E+01 | 1.742497E+01 | 2.450758E+01 |
| X2Y | −9.407982E−01 | −1.845560E+01 | 0.000000E+00 | 2.857360E+00 |
| Y3 | 7.990315E−02 | 1.826735E+00 | 0.000000E+00 | −8.203766E−01 |
| X4 | 2.084759E−01 | 0.000000E+00 | 0.000000E+00 | −1.195250E−01 |
| X2Y2 | 2.343824E−01 | 0.000000E+00 | 0.000000E+00 | 9.400506E−02 |
| Y4 | 6.849174E−02 | 0.000000E+00 | 0.000000E+00 | 1.027239E−01 |
| X4Y | −3.590847E−02 | 0.000000E+00 | 0.000000E+00 | 5.178501E−02 |
| X2Y3 | −1.676285E−02 | 0.000000E+00 | 0.000000E+00 | 5.698284E−02 |
| Y5 | 1.244977E−03 | 0.000000E+00 | 0.000000E+00 | 2.110062E−01 |
| X6 | 7.609826E−04 | 0.000000E+00 | 0.000000E+00 | 1.852743E−03 |
| X4Y2 | 1.642005E−02 | 0.000000E+00 | 0.000000E+00 | −5.347458E−02 |
| X2Y4 | 6.253616E−03 | 0.000000E+00 | 0.000000E+00 | −2.587706E−01 |
| Y6 | 1.353703E−03 | 0.000000E+00 | 0.000000E+00 | 1.608009E−01 |
| X6Y | −2.568254E−03 | 0.000000E+00 | 0.000000E+00 | 5.587846E−04 |
| X4Y3 | −4.755388E−03 | 0.000000E+00 | 0.000000E+00 | 5.397733E−02 |
| X2Y5 | −6.793506E−04 | 0.000000E+00 | 0.000000E+00 | −2.400347E−01 |
| Y7 | −1.374859E−05 | 0.000000E+00 | 0.000000E+00 | 2.641466E−01 |
| X8 | 2.488086E−04 | 0.000000E+00 | 0.000000E+00 | 5.593305E−04 |
| X6Y2 | 1.255585E−03 | 0.000000E+00 | 0.000000E+00 | 6.244473E−03 |
| X4Y4 | 1.194473E−03 | 0.000000E+00 | 0.000000E+00 | 1.145315E−01 |
| X2Y6 | 3.001214E−04 | 0.000000E+00 | 0.000000E+00 | 8.712058E−02 |
| Y8 | 5.813757E−05 | 0.000000E+00 | 0.000000E+00 | 6.570255E−01 |
| X8Y | 0.000000E+00 | 0.000000E+00 | 0.000000E+00 | 0.000000E+00 |
| X6Y3 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 |
| Y9 | 0.000000E+00 | 0.000000E+00 | 0.000000E+00 | 0.000000E+00 |
| X10 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 |
| Y10 | 0.000000E+00 | 0.000000E+00 | 0.000000E+00 | 0.000000E+00 |
| Nradius | 7.497396E+01 | 2.029987E+02 | 2.738127E+02 | 2.966746E+02 |

| Coefficient | M8 | M7 | M6 | M5 | M4 |
|---|---|---|---|---|---|
| Y-decentre | 0.000 | −116.456 | 154.238 | 192.354 | 412.808 |
| X-rotation | 4.164 | 8.327 | 3.019 | 9.973 | −2.768 |

| Coefficient | M3 | M2 | M1 | Image plane |
|---|---|---|---|---|
| Y-decentre | 554.416 | 783.491 | 867.803 | 0.000 |
| X-rotation | −2.829 | 8.552 | 0.503 | 0.000 |

As can be seen from the preceding description of the embodiments, the projection optical system 9 is configured in such a way that it has an intermediate image in the two principal planes.

As can also be seen from the previous description of the embodiments, the imaging scales of the projection optical system 9, in particular of the two part lens systems 26, 27, in the direction of the two principal planes, in each case have the same sign. In particular, they both have a positive sign. Therefore no image flip occurs.

To produce a microstructured or nanostructured component, the projection exposure system 1 is used as follows: firstly, the reticle 7 and the wafer 12 are provided. A structure on the reticle 7 is then projected onto a light-sensitive layer of the wafer 12 with the aid of the projection exposure system 1. By developing the light-sensitive layer, a microstructure or nanostructure is then produced on the wafer 12 and therefore the microstructured component, for example a semiconductor component in the form of a highly integrated circuit, is produced.

During the exposure of the light-sensitive layer on the wafer 12, the latter is displaced with the aid of the wafer holder 13 in the scanning direction. In this case, the displacement takes place, in particular, synchronously with respect to a displacement of the reticle 7 with the aid of the reticle holder 8 in the scanning direction. The reduced imaging scale of the projection optical system 9 in the scanning direction can be compensated by a higher scanning speed.

What is claimed is:

1. An imaging optical system, wherein:
   an object-side main beam angle for a field center point of the imaging optical system is less than 7°;
   the imaging optical system has an image-side numerical aperture of at least 0.4;
   the imaging optical system has an imaging scale of 1:4 in a direction perpendicular to a scanning direction of the imaging optical system; and
   the imaging optical system a microlithographic imaging optical system.

2. The imaging optical system of claim 1, wherein the imaging optical system has a circular exit pupil.

3. The imaging optical system of claim 2, comprising a mirror comprising a freeform face.

4. The imaging optical system of claim 3, wherein:
   the imaging optical system has a first imaging scale in a first direction;
   the imaging optical system has a second imaging scale in a second direction; and
   a ratio of the second imaging scale to the first imaging scale is at least 4:3.

5. The imaging optical system of claim 4, wherein the imaging optical system has a direction-dependent object-side numerical aperture.

6. The imaging optical system of claim 5, comprising a plurality of mirrors.

7. The imaging optical system of claim 1, comprising a mirror comprising a freeform face.

8. The imaging optical system of claim 7, wherein:
the imaging optical system has a first imaging scale in a first direction;
the imaging optical system has a second imaging scale in a second direction; and
a ratio of the second imaging scale to the first imaging scale is at least 4:3.

9. The imaging optical system of claim 8, wherein the imaging optical system has a direction-dependent object-side numerical aperture.

10. The imaging optical system of claim 9, comprising a plurality of mirrors.

11. The imaging optical system of claim 1, wherein:
the imaging optical system has a first imaging scale in a first direction;
the imaging optical system has a second imaging scale in a second direction; and
a ratio of the second imaging scale to the first imaging scale is at least 4:3.

12. The imaging optical system of claim 11, wherein the imaging optical system has a direction-dependent object-side numerical aperture.

13. The imaging optical system of claim 12, comprising a plurality of mirrors.

14. The imaging optical system of claim 1, wherein the imaging optical system has a direction-dependent object-side numerical aperture.

15. The imaging optical system of claim 14, comprising a plurality of mirrors.

16. The imaging optical system of claim 1, comprising a plurality of mirrors.

17. An optical system, comprising:
an illumination optical system configured to transfer radiation from a radiation source to an object field; and
an imaging optical system according to claim 1,
wherein the imaging optical system is configured to project an image in the object field into an image field.

18. A projection exposure system, comprising:
a radiation source; and
an optical system, comprising:
an illumination optical system configured to transfer radiation from the radiation source to an object field; and
an imaging optical system according to claim 1,
wherein the imaging optical system is configured to project an image in the object field into an image field.

19. The projection exposure system of claim 18, further comprising a holder configured to move in a scanning direction and to hold an object in the object field, wherein the imaging scale of the imaging optical system in a scanning direction is less than the imaging scale of the imaging optical system in a direction perpendicular to the scanning direction.

20. A method of using a projection exposure system comprising an illumination optical system and an imaging optical system, the method comprising:
using the illumination optical system to illumination an object in an object plane of the imaging optical system; and
using the imaging optical system to project a structure of the object onto a radiation-sensitive material,
wherein the imaging optical system comprises an imaging optical system according to claim 1.

* * * * *

UNITED STATES PATENT AND TRADEMARK OFFICE
CERTIFICATE OF CORRECTION

PATENT NO. : 10,007,187 B2  
APPLICATION NO. : 15/426408  
DATED : June 26, 2018  
INVENTOR(S) : Hans-Juergen Mann Page 1 of 1

It is certified that error appears in the above-identified patent and that said Letters Patent is hereby corrected as shown below:

On the Title Page

Item (Notice), Line 3: After "0 days." delete "days.".

In the Specification

Column 9, Line 8: Delete "-2.824781 E-03" and insert -- -2.824781E-03 --, therefor.

In the Claims

Column 18, Line 28: In Claim 20, delete "illumination" and insert -- illuminate --, therefor.

Signed and Sealed this
Eighteenth Day of September, 2018

Andrei Iancu
*Director of the United States Patent and Trademark Office*